(12) United States Patent
Dvorak et al.

(10) Patent No.: US 10,971,598 B1
(45) Date of Patent: Apr. 6, 2021

(54) METHOD OF FORMING HETEROJUNCTION BIPOLAR TRANSISTOR (HBT)

(71) Applicant: Keysight Technologies, Inc., Santa Rosa, CA (US)

(72) Inventors: Martin W. Dvorak, Santa Rosa, CA (US); Rory R. Stine, Santa Rosa, CA (US); Mathias Bonse, Santa Rosa, CA (US); Shusen Huang, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 19 days.

(21) Appl. No.: 16/586,260

(22) Filed: Sep. 27, 2019

(51) Int. Cl.
*H01L 21/304* (2006.01)
*H01L 29/66* (2006.01)
(Continued)

(52) U.S. Cl.
CPC .. *H01L 29/66242* (2013.01); *H01L 21/02293* (2013.01); *H01L 21/02697* (2013.01);
(Continued)

(58) Field of Classification Search
CPC ......... H01L 21/02378; H01L 21/02381; H01L 21/02392; H01L 21/02395;
(Continued)

(56) References Cited

U.S. PATENT DOCUMENTS 6,316,332 B1 * 11/2001 Lo .............. H01L 21/185
257/E21.087
7,749,863 B1 * 7/2010 Micovic ............ H01L 21/76254
438/459
(Continued)

FOREIGN PATENT DOCUMENTS

JP 2016171172 A 9/2016

OTHER PUBLICATIONS

English translation of JP2016171172A, 16 pgs.
(Continued)

*Primary Examiner* — Stephen W Smoot

(57) ABSTRACT

A method of forming an HBT structure includes forming an HBT epitaxial layer structure over a first substrate wafer; performing a first substrate transfer of the HBT epitaxial layer structure and the first substrate wafer onto a second substrate wafer, including inverting the HBT epitaxial layer structure and the first substrate wafer; removing the first substrate wafer; forming a first subcollector metal layer over the HBT epitaxial layer structure; performing a second substrate transfer of the subcollector metal layer and the HBT epitaxial layer structure onto a third substrate wafer with a second subcollector metal layer, including inverting the subcollector metal layer and the epitaxial layer structure; compression bonding the first and second subcollector metal layers to provide a bonded subcollector metal layer; and removing the second substrate wafer. The HBT structure includes the third substrate wafer, the bonded subcollector metal layer, and the HBT epitaxial layer structure.

20 Claims, 9 Drawing Sheets

(51) Int. Cl.
*H01L 21/02* (2006.01)
*H01L 21/67* (2006.01)
*H01L 21/20* (2006.01)
*H01L 21/321* (2006.01)
*H01L 21/3205* (2006.01)
*H01L 21/3213* (2006.01)
*H01L 21/78* (2006.01)
*H01L 29/737* (2006.01)
*H01L 21/603* (2006.01)

(52) U.S. Cl.
CPC ........ *H01L 21/2007* (2013.01); *H01L 21/304* (2013.01); *H01L 21/3212* (2013.01); *H01L 21/32051* (2013.01); *H01L 21/32133* (2013.01); *H01L 21/67075* (2013.01); *H01L 21/7806* (2013.01); *H01L 29/737* (2013.01); *H01L 2021/603* (2013.01)

(58) Field of Classification Search
CPC ........... H01L 21/02697; H01L 21/2007; H01L 21/304; H01L 21/30604; H01L 21/30625; H01L 21/32051; H01L 21/3212; H01L 21/3213; H01L 21/32133; H01L 21/32134; H01L 21/32135; H01L 2021/603; H01L 21/7806; H01L 21/7813; H01L 21/8213; H01L 29/66242; H01L 29/737; H01L 29/7371
See application file for complete search history.

(56) References Cited

U.S. PATENT DOCUMENTS

| 8,350,295 B1* | 1/2013 | Saunier ............. H01L 29/66318 257/194 |
| 8,860,092 B1 | 10/2014 | Li et al. |
| 8,895,421 B2* | 11/2014 | Parikh ..................... H01L 29/30 438/571 |
| 9,087,854 B1 | 7/2015 | Ha et al. |
| 9,461,026 B2* | 10/2016 | Dallesasse ............ H01L 21/822 |
| 2013/0119404 A1 | 5/2013 | Saunier, III et al. |
| 2016/0141220 A1* | 5/2016 | Watanabe ................ H01L 24/05 257/197 |
| 2017/0301772 A1* | 10/2017 | Radway .............. H01L 29/7781 |

OTHER PUBLICATIONS

Yuta Shiratori et al., "Low-Thermal-Resistance InP/GaAsSb DHBTs with a Metal Subcollector Fabricated with Surface-Activated Wafer Bonding," CSW 2015—Santa Barbara, CA, pp. 201-202.

* cited by examiner

METHOD OF FORMING HETEROJUNCTION BIPOLAR TRANSISTOR (HBT)

BACKGROUND

A double heterojunction bipolar transistor (DHBT) or a heterojunction bipolar transistor (HBT) (collectively, "HBT") is a type of bipolar junction transistor (BJT) that incorporates different semiconductor materials in collector, base and emitter layers, respectively, creating heterojunctions at both the emitter-base junction and the base-collector junction. HBTs have better performance characteristics than BJTs at high frequencies, and therefore are often used in integrated circuits (ICs) for high frequency radio frequency (RF) signals in modern communication devices. The collector, base and emitter layers are typically epitaxial (epi) layers (films) grown over a semiconductor substrate, such as indium phosphide (InP), for example.

A conventional HBT also typically includes an InP subcollector layer located between the substrate and an epi stack of the HBT formed by the collector, base and emitter layers. The InP subcollector layer is relatively thick compared to the collector, base and emitter layers in order to enhance electrical performance. However, heat generated during operation of the HBT must be removed through the relatively thick InP subcollector layer, as well as through the InP substrate over which the InP subcollector layer is formed, which provide high thermal resistance. Conventional HBTs are therefore susceptible to overheating. For example, electrical performance characteristics of an IC including HBTs typically improve when operated at higher power. However, operation at too high of a power causes excessive self-heating of the HBTs, which degrades the lifetime of the IC. Also, design complexity of the IC is constrained by thermal factors caused by the poor thermal conductivity of the HBTs.

Changes to HBT designs are limited, as a practical matter, by conventional fabrication techniques with regard to growing the epi layers. These fabrication techniques require additional specialty equipment, such as chemical mechanical polishing (CMP) equipment that provide adequate wafer flatness for wafer bonding between oxide and semiconductor layers of the DHBT, for example. Further, conventional HBTs are often designed around a single substrate transfer, which occurs during fabrication to replace the substrate.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
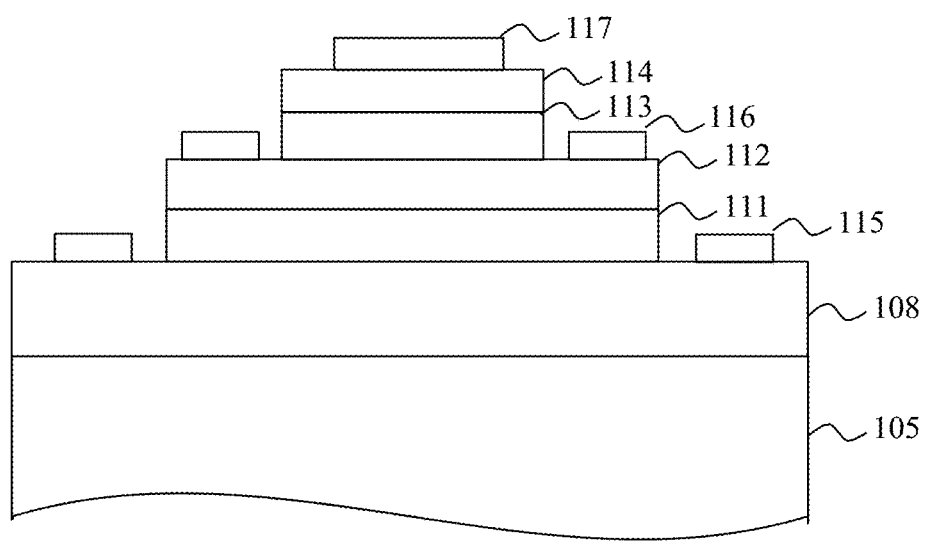
FIG. 1 is a simplified block diagram of a heterojunction bipolar transistor (HBT), according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, according to various embodiments, multiple substrate transfers (or epi transfers) are performed during fabrication of the HBT structure to replace both the indium phosphide (InP) substrate and InP subcollector with higher thermal conductivity materials. Examples of the highly thermally conductive materials include silicon carbide (SiC) and silicon (Si) for the substrate and titanium (Ti), platinum (Pt) and gold (Au) for the subcollector. The substrate transfers are performed on the wafer scale of the fabrication process, e.g., as opposed to the chip scale, to enable use of techniques to process a large number of HBT structures simultaneously and to enable use of thermal compression bonding techniques, for example, not otherwise available after chip scale processing. Thus, according to the embodiments, a metal stack (e.g., two bonded subcollector metal layers) replaces the InP subcollector. Metals have significantly higher thermal (and electrical) conductivity than InP, and therefore the metal stack more efficiently transfers heat away from the HBT.

Unlike most conventional HBT fabrication processes that include an InP substrate and/or subcollector layer, the present disclosure includes two substrate transfers (epi transfers). A first substrate transfer is performed to provide an intermediate handle wafer, and a second substrate transfer is performed to provide the final, highly thermally conductive substrate. In addition, in order to simplify manufacturing support required for bonding process, and to provide a more robust finished product, a single metal-to-metal bonding process may be used for both substrate transfer steps.

FIG. 1 is a simplified block diagram of a heterojunction bipolar transistor (HBT) device, according to a representative embodiment.

Referring to FIG. 1, an HBT device 100 includes a substrate 105, a subcollector 108 on the substrate 105, and an HBT epitaxial structure 110 on the subcollector 108, in an illustrative triple mesa layout. The substrate 105 is formed of a material having high thermal conductivity, such as silicon (Si) or silicon carbide (SiC), as opposed to InP used in conventional HBTs, in order to more efficiently conduct heat away from the HBT epitaxial structure 110 during operation. The subcollector 108 is formed of metal, such as titanium (Ti), platinum (Pt) and/or gold (Au), for example, which also has high thermal as well as electrical conductivity, as opposed to dielectric material used in conventional HBTs. Again, the metal subcollector 108 more efficiently conducts heat away from the HBT epitaxial structure 110. Also, there is no adhesive material in or adjacent to the subcollector 108 since the metal of the subcollector 108 is compression bonded (and not glued) during fabrication, as discussed below. The absence of adhesive material further enables the subcollector 108 to more efficiently conduct heat.

The HBT epitaxial structure 110 may have any compatible construction, as would be apparent to one skilled in the art. In the depicted embodiment, the HBT epitaxial structure 110 includes an n− doped collector 111, a p− doped base 112 formed on the collector 111, an n− doped emitter 113 formed on the base 112, and a heavily doped n+ emitter cap 114 formed on the emitter 113. As an example, the collector 111 may be formed of InP, the base 112 may be formed of gallium arsenide antimonide (GaAsSb), the emitter 113 may be formed of quaternary aluminum gallium indium arsenide (AlGaInAs), and the emitter cap 114 may be formed of gallium indium arsenide (GaInAs) and/or indium arsenide (InAs), although the HBT epitaxial structure 110 may be formed of other materials compatible with epitaxial growth, without departing from the scope of the present teachings.

The HBT device 100 further includes subcollector contact 115 to provide electrical connections to the collector 111 via the subcollector 108, base contact 116 to provide electrical connections to the base 112, and emitter contact 117 to provide electrical connection to the emitter 113. Because the subcollector 108 and the substrate 105 of the depicted embodiment are efficient conductors of heat, there is no need to try to dissipate heat from the HBT epitaxial structure 110 through the collector contact 115, for example, as in various conventional structures. Although FIG. 1 shows only one each of the subcollector contact 115, the base contact 116 and the emitter contact 117 (wrapped around the HBT device 100, as shown in the cross-sectional view), it is understood that in various alternative configurations, there may be additional subcollector, base and/or emitter contacts, without departing from the scope of the present teachings.

Figure 2:
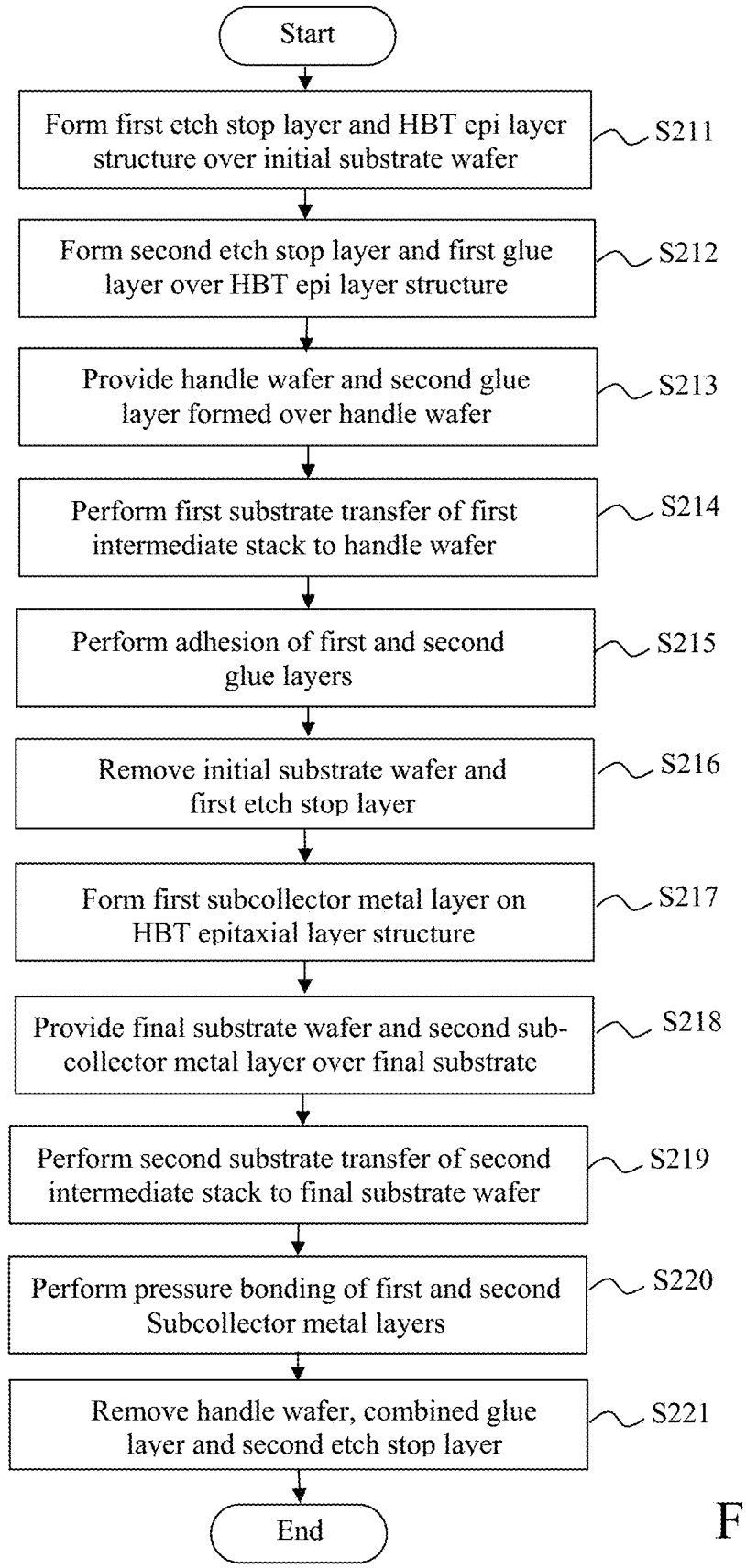
FIG. 2 is a flow diagram of a method for forming an HBT structure, according to a representative embodiment.

FIG. 2 is a simplified flow diagram of a method for forming an HBT structure, such as an HBT mesa structure, according to a representative embodiment, and FIGS. 3A to 3H are simplified cross-sections of a layered structure at stages of fabricating an HBT structure, corresponding to the steps in FIG. 2, according to a representative embodiment.

The steps in FIG. 2 and the corresponding cross-sections in FIGS. 3A to 3K are performed on the wafer scale, prior to chip processing.

Figure 3A:
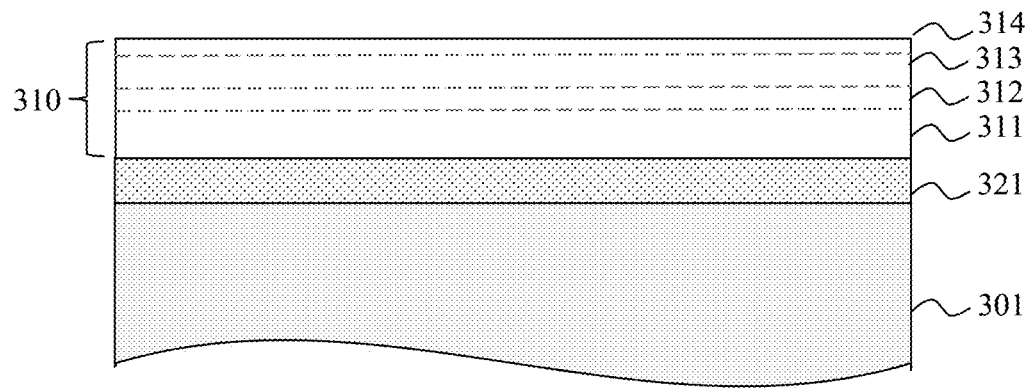
FIG. 3A is a simplified cross-section of a layered structure including a first etch stop layer and an HBT epi layer structure on an initial substrate wafer, corresponding to a fabrication step in FIG. 2, according to a representative embodiment.

Referring to FIG. 2 and FIG. 3A, a first etch stop layer 321 and an HBT epitaxial layer structure 310 are provided over an initial substrate wafer (first substrate wafer) 301 in block S211. The first etch stop layer 321 is epitaxially grown on the initial substrate wafer 301, and the HBT epitaxial layer structure 310 is epitaxially grown on the first etch stop layer 321. The initial substrate wafer 301 is formed of InP in order to enable the epitaxial growth of subsequently added materials, including those forming the first etch stop layer 321 and the HBT epitaxial layer structure 310. The initial substrate wafer 301 may have a thickness of about 350 µm to about 750 µm, for example. The first etch stop layer 321 may be formed of any epitaxially grown material, lattice matched to the initial substrate wafer 301, able to block etching processes in subsequent steps, discussed below, depending on the type of etching to be performed. For example, the first etch stop layer 321 may be formed of a semiconductor material, such as gallium indium arsenide (GaInAs), which is an effective etch stop material for an acid wet etching process, having a thickness of about 12 nm to about 200 nm, for example.

The HBT epitaxial layer structure 310 is grown over the initial substrate wafer 301 (and the first etch stop layer 321) in a known manner, and corresponds to the layers of the HBT epitaxial structure 110, discussed above. That is, in the depicted embodiment, the HBT epitaxial layer structure 310 includes an n− doped collector layer 311, a p− doped base layer 312 formed on the collector layer 311, an n− doped emitter layer 313 formed on the base layer 312, and a heavily doped n+ emitter cap 314 formed on the emitter layer 313. As an example, the collector layer 311 may be formed of InP, the base layer 312 may be formed of GaAsSb, the emitter layer 313 may be formed of quaternary AlGaInAs, and the emitter cap 314 may be formed of GaInAs and/or InAs, although the layers of the HBT epitaxial layer structure 310 may be formed of other materials compatible with epitaxial growth, without departing from the scope of the present teachings.

Figure 3B:
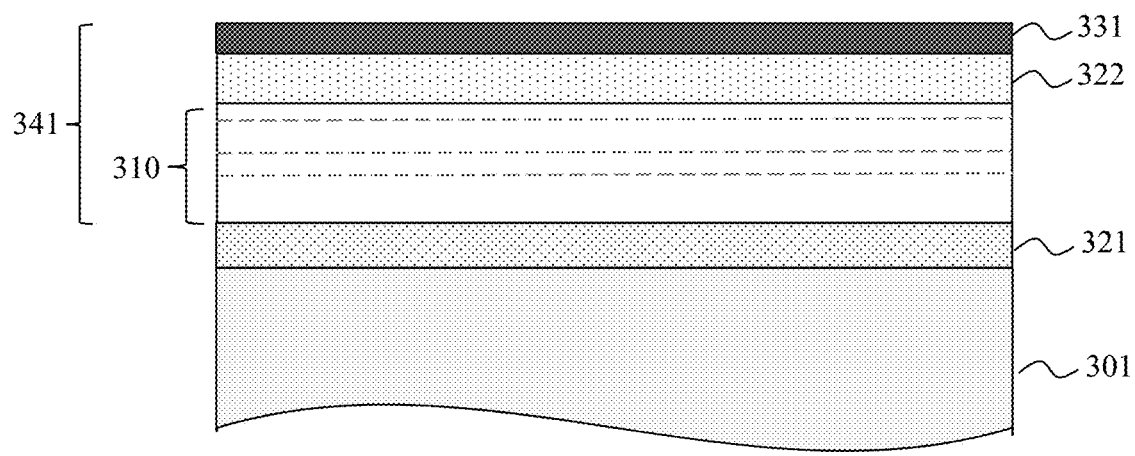
FIG. 3B is a simplified cross-section of a layered structure including a second etch stop layer and a first glue layer on an HBT epi layer structure, corresponding to a fabrication step in FIG. 2, according to a representative embodiment.

Referring to FIG. 2 and FIG. 3B, a second etch stop layer 322 and a first glue layer 331 are formed over the HBT epitaxial layer structure 310 to provide a first intermediate stack 341 in block S212. The second etch stop layer 322 may be epitaxially grown on the HBT epitaxial layer structure 310, formed on the HBT epitaxial layer structure 310 by physical vapor deposition (PVD), chemical vapor deposition (CVD), plasma-enhanced chemical vapor deposition (PECVD), or spin-coating, for example. The first glue layer 331 may be applied to the second etch stop layer 322 by PVD (when using metal), CVD or spin-coating, for example. The second etch stop layer 322 may be formed of any material able to block etching processes in subsequent steps, discussed below, depending on the type of etching to be performed. For example, the second etch stop layer 322 may be formed of a dielectric material, such as silicon dioxide ($SiO_2$) deposited by PECVD, that can be removed selectively from the HBT epitaxial layer structure 310 by an acid wet etching process, and may have a have a thickness of about 10 nm to about 500 nm, for example. The first glue layer 331 may be an adhesive or glue metal, such as a metal stack including gold (Au), for example.

Figure 3C:
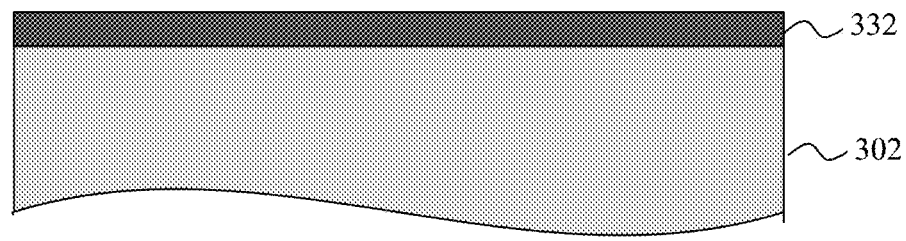
FIG. 3C is a simplified cross-section of a layered structure including a handle wafer with a second glue layer, corresponding to a fabrication step in FIG. 2, according to a representative embodiment.
Figure 3D:
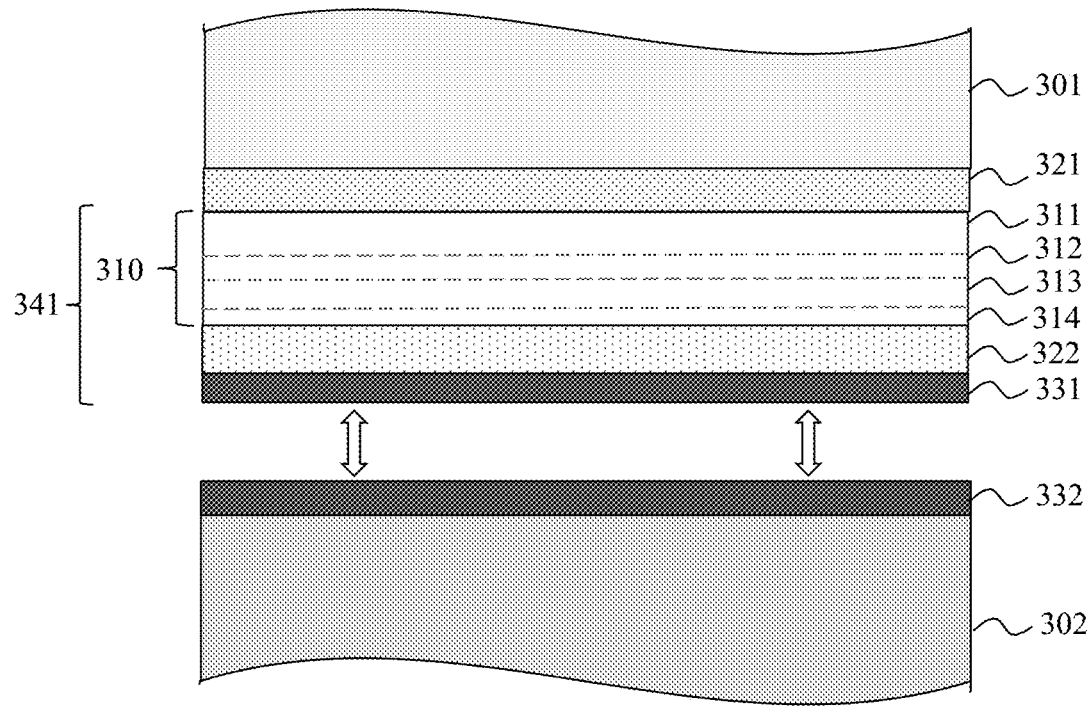
FIG. 3D is a simplified cross-section of a layered structure following a first substrate transfer to the handle wafer, corresponding to a fabrication step in FIG. 2, according to a representative embodiment.

Referring to FIG. 2 and FIG. 3C, a handle wafer (second substrate wafer) 302 and a second glue layer 332 formed over the handle wafer 302 are provided in block S213. The handle wafer 302 is formed of a substrate material, such as gallium arsenide (GaAs), Si, or InP, for example, that can be subsequently removed using a wet etch process, as discussed below. When the handle wafer 302 is InP, an etch stop coating (not shown) is added to protect the InP material during subsequent etching of the initial substrate wafer 301, discussed below with reference to block S216. The etch stop coating may be formed by PVD, CVD, PECVD, or spin-coating, for example. The handle wafer 302 may have a thickness of about 350 µm to about 750 µm, for example. The second glue layer 332 may be the same material as the first glue layer 331, and may be applied to the handle wafer 302 by PVD, for example. Alternatively, the first and second glue layers 331 and 332 may be formed of different materials, capable of bonding.

Figure 3E:
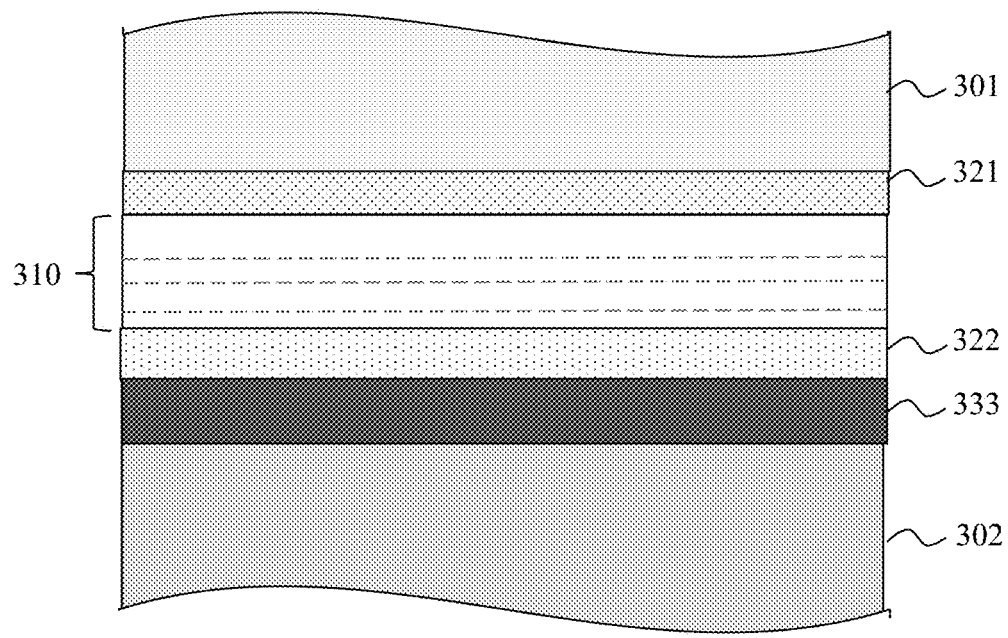
FIG. 3E is a simplified cross-section of a layered structure including a combined glue layer, corresponding to a fabrication step in FIG. 2, according to a representative embodiment.

A first substrate transfer is then performed, moving the first intermediate stack 341 to the handle wafer 302. That is, referring to FIG. 2 and FIG. 3D, the first intermediate stack 341 is inverted and positioned over the handle wafer 302 (or the handle wafer 302 is positioned beneath the first intermediate stack 341), and the first intermediate stack 341 and the handle wafer 302 are brought into contact with one another, in block S214. The first substrate transfer is performed using known substrate transfer techniques. Referring to FIG. 2 and FIG. 3E, adhesion is performed between the first glue layer 331 and the second glue layer 332 in block S215 to form combined glue layer 333 using know processes. The first and second glue layers 331 and 332 may be adhered by curing the adhesive material of the first and second glue layers 331 and 332, for example. Alternatively, when the first and second glue layers 331 and 332 are glue metal layers, they may be combined by metal-to-metal bonding (e.g., Au to Au bonding), such as thermal compression bonding. Alternatively, depending on the respective materials of the first and second glue layers 331 and 332, the bonding may be oxide-to-oxide bonding or oxide-to-metal bonding.

Figure 3F:
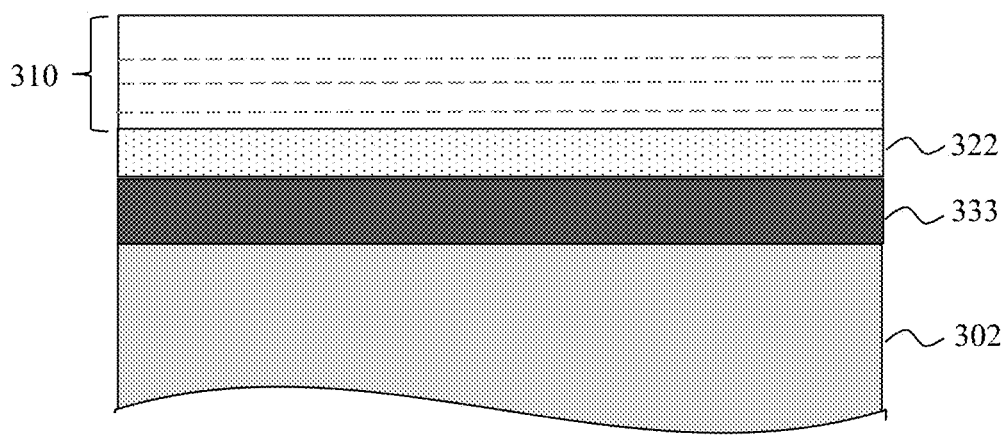
FIG. 3F is a simplified cross-section of a layered structure including following removal of the initial substrate wafer and the first etch stop layer, corresponding to a fabrication step in FIG. 2, according to a representative embodiment.

Referring to FIG. 2 and FIG. 3F, the initial substrate wafer 301 and the first etch stop layer 321 are removed from the first intermediate stack 341 to expose the HBT epitaxial layer structure 310 in block S216. The initial substrate wafer 301 may be removed using a wet etching technique, such as hydrochloric acid (HCl)-based wet etching, for example, which is effective for removing InP material. During the wet etching, the first etch stop layer 321 protects the HBT epitaxial layer structure 310. The first etch stop layer 321 is then removed, for example, using a wet etching technique, such as phosphoric acid ($H_3PO_4$)/hydrogen peroxide ($H_2O_2$)-based wet etching, for example. Alternatively, the initial substrate wafer 301 and/or the first etch stop layer 321 may be removed, all or in part, by grinding followed by chemical mechanical polishing (CMP), for example. Any compatible etching techniques may be incorporated, without departing from the scope of the present teachings.

Figure 3G:
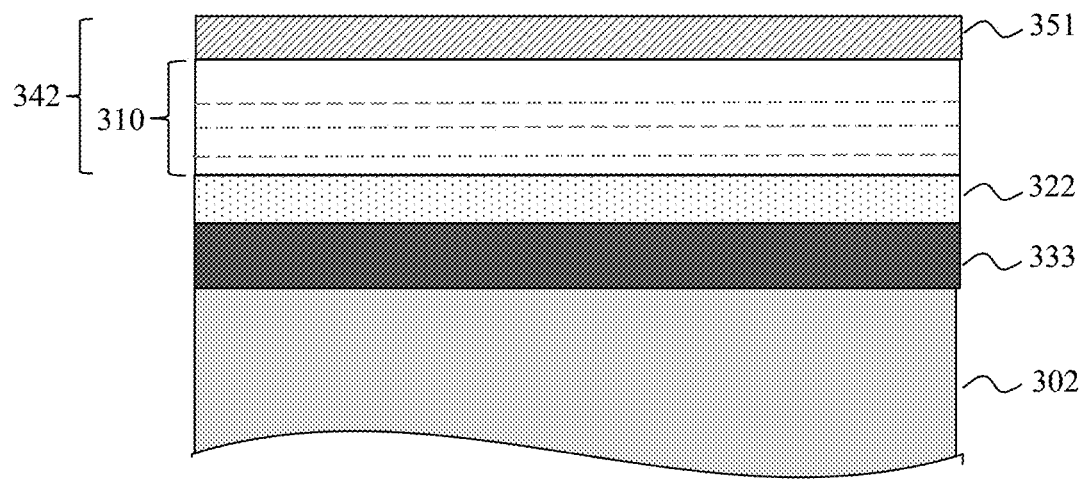
FIG. 3G is a simplified cross-section of a layered structure including a first subcollector layer the HBT epi layer structure, corresponding to a fabrication step in FIG. 2, according to a representative embodiment.

Referring to FIG. 2 and FIG. 3G, a first subcollector metal layer 351 is formed on the exposed HBT epitaxial layer structure 310 to provide a second intermediate stack 342 in block S217. The first subcollector metal layer 351 may be formed of any compatible, highly thermally conductive metal, such as titanium (Ti), platinum (Pl) and/or gold (Au), for example. The first subcollector metal layer 351 may have a thickness of about 50 nm to about 500 nm, for example. Because of the inversion during the first substrate transfer, the first subcollector metal layer 351 is applied to the collector layer 311 of the HBT epitaxial layer structure 310. The first subcollector metal layer 351 may be applied by electron beam evaporation or other PVD process, for example.

Figure 3H:
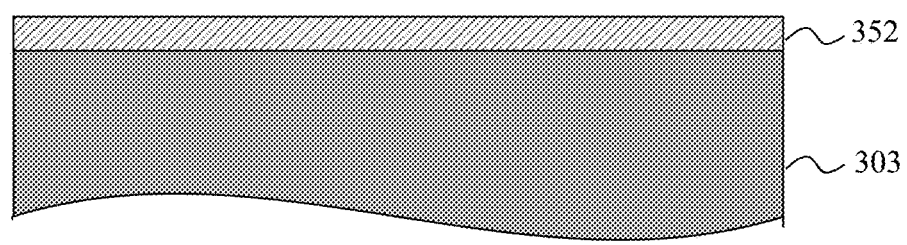
FIG. 3H is a simplified cross-section of a layered structure including a final substrate wafer with a second subcollector layer, corresponding to a fabrication step in FIG. 2, according to a representative embodiment.
Figure 3I:
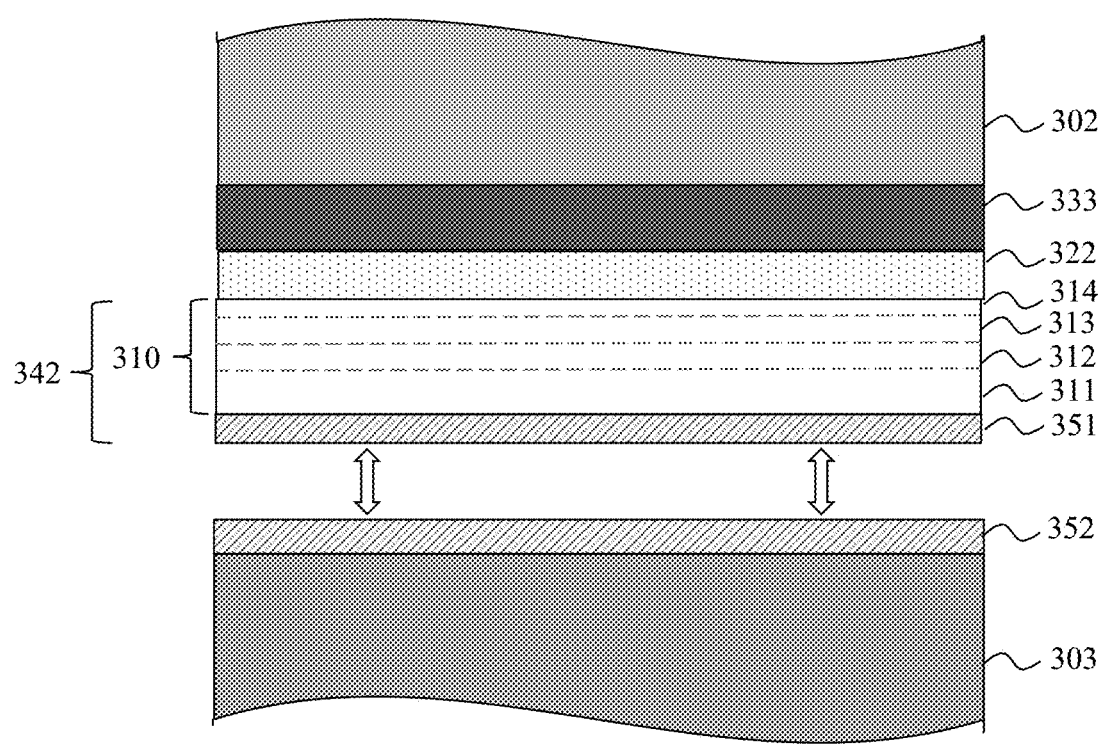
FIG. 3I is a simplified cross-section of a layered structure following a second substrate transfer to the final substrate wafer, corresponding to a fabrication step in FIG. 2, according to a representative embodiment.

Referring to FIG. 2 and FIG. 3H, a final substrate wafer (third substrate wafer) 303 and a second subcollector metal layer 352 formed over the final substrate wafer 303 are provided in block S218. The final substrate wafer 303 is formed of a material that is highly thermally (and electrically) conductive, such as Si or SiC, for example, so that heat can be efficiently transferred from the HBT epitaxial structure through the final substrate in the finished device, as discussed above with reference to FIG. 1. The final substrate wafer 303 may have a thickness of about 350 µm to about 750 µm, for example. At least a portion of the second subcollector metal layer 352 is typically formed of the same material as the first subcollector metal layer 351 (e.g., Ti, Pt and/or Au) to facilitate bonding. For example, in thermal compression bonding, at least the materials of the first and second subcollector metal layers 351 and 352 directly facing each other are the same. The second subcollector metal layer 352 may have a thickness of about 50 nm to about 500 nm, for example. The second subcollector metal layer 352 may be applied to the final substrate wafer 303 by PVD, for example.

A second substrate transfer is then performed, moving the second intermediate stack 342 to the final substrate wafer 303. That is, referring to FIG. 2 and FIG. 3I, the second intermediate stack 342 is inverted and positioned over the final substrate wafer 303 (or the final substrate wafer 303 is positioned beneath the second intermediate stack 342), and the second intermediate stack 342 and the final substrate wafer 303 are brought into contact with one another, in block S219. The second substrate transfer is performed using known substrate transfer techniques.

Figure 3J:
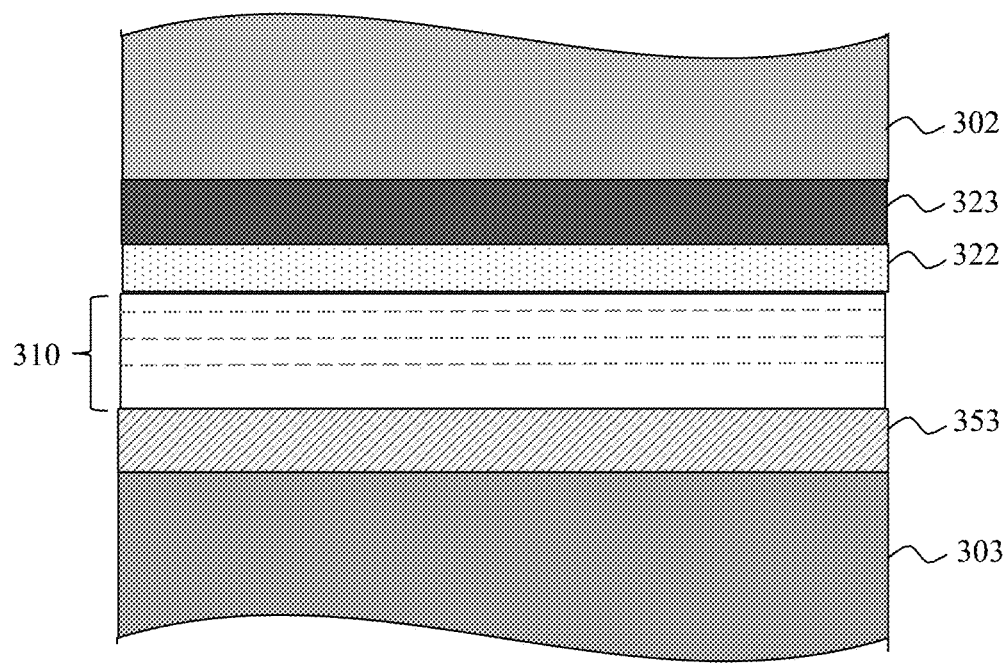
FIG. 3J is a simplified cross-section of a layered structure including a compression bonded subcollector layer, corresponding to a fabrication step in FIG. 2, according to a representative embodiment.

Referring to FIG. 2 and FIG. 3J, bonding is performed between the first subcollector metal layer 351 and the second subcollector metal layer 352 in block S220 to form bonded subcollector metal layer 353. The first and second subcollector metal layers 351 and 352 may be bonded or merged using thermal compression bonding, although other bonding techniques may be incorporated without departing from the scope of the present teachings. For example, other bonding techniques include eutectic bonding, zero pressure bonding at room temperature (with properly prepared surfaces), and $SiO_2$-to-$SiO_2$ bonding at room temperature. The $SiO_2$-to-$SiO_2$ bonding may be performed just by laying the handle wafer 302 and the final substrate wafer 303 that had both received a suitable surface treatment on top of each other, and initiating bonding with low-pressure intentional contact in the center. Annealing may be performed after the fact to hasten the reaction that makes the bond permanent. The bonding results in a single layer of diffusion bonded material as bonded subcollector metal layer 353. The bonded subcollector metal layer 353 thus provides a subcollector formed of thermally and electrically conductive metal, such as Ti, Pt and/or Au, as opposed to a semiconductor (e.g., InP) subcollector as in typical conventional HBT structures. The bonded subcollector metal layer 353 may have a total thickness of about 100 nm to about 1000 nm, for example.

Because the bonding is performed on the wafer scale, e.g., as opposed to the chip scale, the final substrate wafer 303 and the second intermediate stack 342 are sufficiently robust to withstand the high pressure and high temperatures involved in thermal compression bonding, in particular, without damaging the HBT epitaxial layer structure 310. For example, thermal compression bonding may require the first and second subcollector metal layers 351 and 352 to be pressed together using a force of between about 0.2 megapascal (MPa) and about 3.5 MPa at a temperature between room temperature and about 350° C. The use of thermal compression bonding provides an integrated, bonded subcollector metal layer 353, which does not include adhesive or other connecting material otherwise required for combining two metal layers. Likewise, zero pressure bonding and $SiO_2$-to-$SiO_2$ bonding may not be able to be performed on the chip scale. For example, the $SiO_2$-to-$SiO_2$ bonding requires atomically flat surfaces (typically less than about 0.5 nm), which is achievable on wafers using CMP, but not on individual chips.

Accordingly, the bonded subcollector metal layer 353 is highly thermally conductive due to the favorable heat transfer properties of the metal from which it is formed, and due to the absence of adhesive material that would otherwise interfere with heat transfer. For example, in a conventional process that would involve application of an adhesive to attach subcollector metal layers, heat would be transferred inefficiently, through the adhesive materials in the subcollector metal layers and/or through collector contacts, for example.

Although a single substrate transfer of a conventional process may be simpler in some respects, the two substrate transfers described herein provide a number of benefits. For example, the two substrate transfers result in the orientation of the HBT epitaxial layer structure 310 on the final substrate wafer 303 being in the same as the orientation of the HBT epitaxial layer structure 310 as when originally grown (e.g., as shown in FIG. 3A). Although an HBT epitaxial layer structure in principle may be grown in the opposite sequence (upside down), there is a tremendous advantage in being able to leverage the learnings from HBTs grown in standard sequence. Epitaxial layers that are conventionally grown upside down simply by reversing the growth recipe, and then inverted by a single substrate transfer, will not be identical to layers grown in the standard sequence because of the nature of epitaxial growth. Such conventional techniques require significant optimization to achieve a match in the electrical and processing behaviors, and even then, not all behaviors may ever be matched.

Figure 3K:
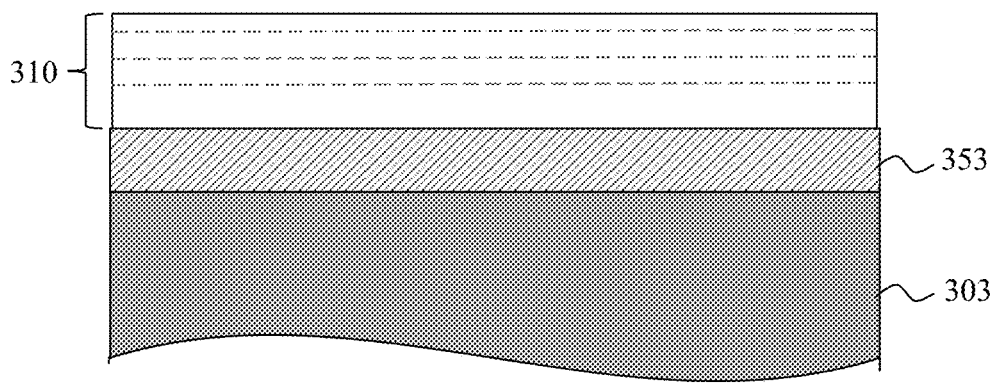
FIG. 3K is a simplified cross-section of a layered structure following removal of the handle wafer, the second etch stop layer and the combined glue layer, corresponding to a fabrication step in FIG. 2, according to a representative embodiment.

Referring to FIG. 2 and FIG. 3K, the handle wafer 302, the combined glue layer 333, and the second etch stop layer 322 are removed from the second intermediate stack 342 to expose the HBT epitaxial layer structure 310 in block S221, thus forming the HBT structure on the wafer scale. The handle wafer 302 may be removed using a wet etching technique, such as sulfuric acid ($H_2SO_4$)/hydrogen peroxide ($H_2O_2$)-based wet etching, for example, which is effective for removing GaAs material. When the handle wafer 302 is formed of Si, it may be removed using potassium hydroxide (KOH) wet etching or plasma dry etching, for example. When the handle wafer 302 is formed of InP, it may be removed using HCl-based wet etching, for example. During the wet etching, the second etch stop layer 322 protects the HBT epitaxial layer structure 310. The combined glue layer 333 and the second etch stop layer 322 are then removed, for example, using a combination of dry etching and wet etching techniques, such as ion milling and selective metal wet etching, for example. Alternatively, the handle wafer 302, the combined glue layer 333, and/or the second etch stop layer 322 may be removed, all or in part, by grinding followed by CMP, for example.

Alternatively, removing the handle wafer 302 may include performing a lift-off of the handle wafer 302 by selectively etching the combined glue layer 333. For example, the combined glue layer 333 may include oxide glue, which may be removed selectively using a hydrofluoric acid (HF) etch without attacking the material of the final substrate wafer 303. Similarly, the combined glue layer 333 may be formed of an adhesive material compatible with thermal or radiation release techniques, enabling lift-off of the handle wafer 302. Alternatively, the combined glue layer 333 may be formed of a material having marginal adhesion, since the combined glue layer 333 need only stick long enough to accommodate use of the handle wafer 302 during a portion of the fabrication process. The marginal adhesion enables the bond to be mechanically broken between the combined glue layer 333 and the second etch stop layer 322 to remove the handle wafer 302, thereby avoiding etching of the handle wafer 302 entirely.

Subsequent processing includes vertical and lateral wet and dry etching of the HBT epitaxial layer structure 310 of the HBT structure to create separate HBT mesa structures (or HBT devices), each of which includes respective portions of the collector layer 311, the base layer 312, the emitter layer 313, and the emitter cap 314, similar to the HBT device 100 shown in FIG. 1. This processing may include applying a pattern to the top surface of the HBT epitaxial layer structure, and dry etching through the pattern to provide the separate HBT mesa structures. In this case, the bonded subcollector metal layer 353 advantageously acts as an etch stop to prevent etching into the final substrate wafer 303. The HBT mesa structures may then be separated for further processing on the chip scale.

Figure 4:
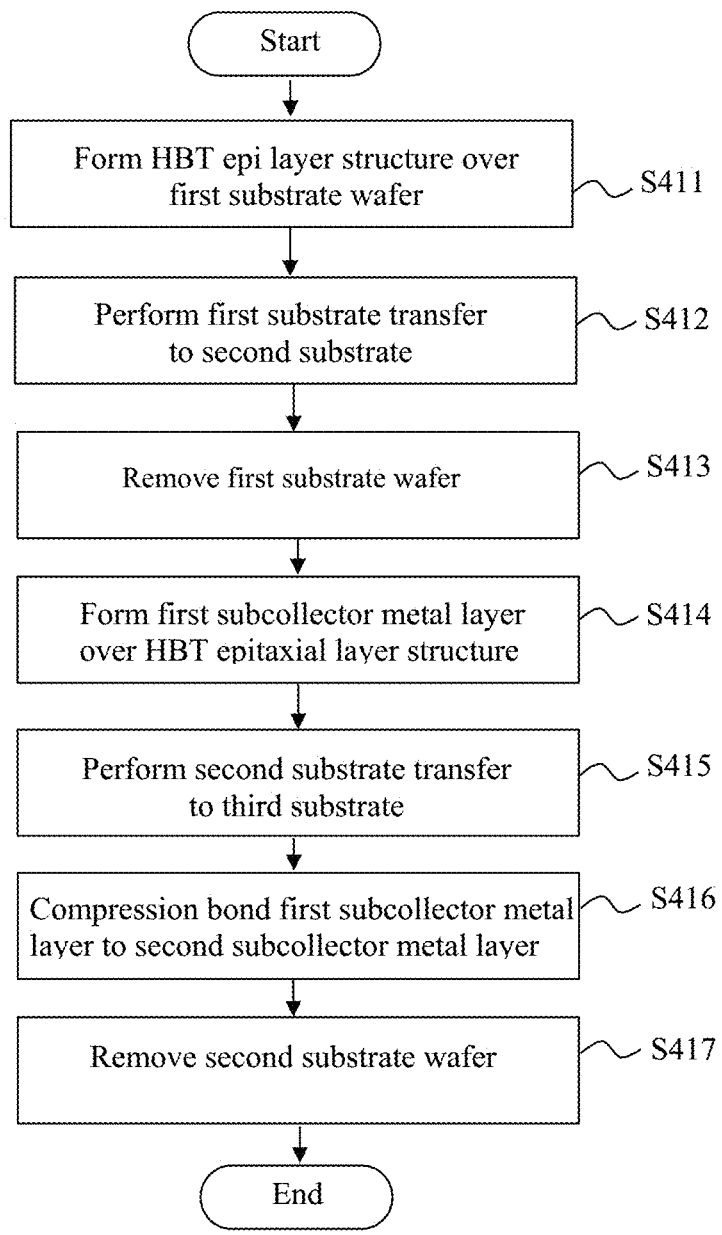
FIG. 4 is a flow diagram of a method for forming an HBT structure, according to a representative embodiment.

FIG. 4 is a simplified, high level flow diagram of a generalized method for forming an HBT structure, according to a representative embodiment.

Referring to FIG. 4, an HBT epitaxial layer structure is formed over a first substrate wafer in block S411. The first substrate wafer may be formed of InP, for example, to enable epitaxial growth of the layers in the HBT epitaxial layer. In block S412, a first substrate transfer is performed, transferring the HBT epitaxial layer structure and the first substrate wafer onto a second substrate wafer (e.g., handle wafer). The first substrate transfer includes inverting the HBT epitaxial layer structure and the first substrate wafer, and bringing the inverted HBT epitaxial layer structure and the first substrate wafer into contact with the second substrate wafer, and joining them using an adhesive metal layer, for example. The first substrate wafer is removed in block S413, for example, by a wet etching process.

In block S414, a first subcollector metal layer is formed over the HBT epitaxial layer structure. The first subcollector metal layer is a good thermal conductor, as well as a good electrical conductor, such as Ti, Pt and/or Au. In block S415, a second substrate transfer is performed, transferring the subcollector metal layer and the HBT epitaxial layer structure onto a third substrate wafer, which includes a second subcollector metal layer. The second substrate transfer includes inverting the first subcollector metal layer and the HBT epitaxial layer structure, and bringing the inverted first subcollector metal layer and HBT epitaxial layer structure into contact with the third substrate wafer. The first and second subcollector metal layers are thermal compression bonded to one another in block S416 to provide a bonded subcollector metal layer. The second substrate wafer is removed in block S417, for example, by a wet etching process. The HBT structure includes the third substrate wafer, the bonded subcollector metal layer on the third substrate wafer, and the HBT epitaxial layer structure on the subcollector metal layer.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of forming a heterojunction bipolar transistor (HBT) structure, comprising:
   forming an HBT epitaxial layer structure over a first substrate wafer;
   performing a first substrate transfer of the HBT epitaxial layer structure and the first substrate wafer onto a second substrate wafer;
   removing the first substrate wafer;
   forming a first subcollector metal layer over the HBT epitaxial layer structure;
   performing a second substrate transfer of the first subcollector metal layer and the HBT epitaxial layer structure onto a third substrate wafer with a second subcollector metal layer;
   thermal compression bonding the first and second subcollector metal layers to provide a bonded subcollector metal layer; and
   removing the second substrate wafer,
   wherein the HBT structure comprises the third substrate wafer, the bonded subcollector metal layer on the third substrate wafer, and the HBT epitaxial layer structure on the bonded subcollector metal layer.

2. The method of claim 1, wherein the HBT epitaxial layer structure comprises a collector layer, a base layer, an emitter layer, and an emitter cap.

3. The method of claim 1, wherein performing the first substrate transfer of the HBT epitaxial layer structure and the first substrate wafer onto the second substrate wafer comprises inverting the HBT epitaxial layer structure and the first substrate wafer.

4. The method of claim 3, wherein performing the first substrate transfer of the HBT epitaxial layer structure and the first substrate wafer onto the second substrate wafer further comprises performing metal-to-metal bonding between a first glue metal layer formed over the HBT epitaxial layer structure and a second glue metal layer formed over the second substrate wafer.

5. The method of claim 3, wherein performing the second substrate transfer of the first subcollector metal layer and the HBT epitaxial layer structure onto the third substrate wafer comprises inverting the first subcollector metal layer and the HBT epitaxial layer structure.

6. The method of claim 1, wherein removing the first substrate wafer comprises hydrochloric acid-based wet etching, and removing the second substrate wafer comprises sulfuric acid/hydrogen peroxide-based etching.

7. The method of claim 1, wherein removing the first substrate wafer and/or removing the second substrate wafer comprises grinding followed by chemical mechanical polishing (CMP).

8. The method of claim 1, further comprising:
etching the HBT structure, using the bonded subcollector metal layer as an etch stop, to form a plurality of HBT mesa structures.

9. A method of forming a heterojunction bipolar transistor (HBT) structure, comprising:
providing a first etch stop layer and an HBT epitaxial layer structure formed over an initial substrate wafer;
forming a second etch stop layer and a first glue metal layer over the HBT epitaxial layer structure to provide a first intermediate stack;
providing a second glue metal layer formed over a handle wafer;
inverting the first intermediate stack, and performing metal-to-metal bonding between the first glue metal layer and the second glue metal layer;
removing the initial substrate wafer and the first etch stop layer from the first intermediate stack to expose the HBT epitaxial layer structure;
forming a first subcollector metal layer on the HBT epitaxial layer structure to provide a second intermediate stack;
providing a second subcollector metal layer formed over a final substrate wafer;
inverting the second intermediate stack, and performing metal-to-metal bonding between the first subcollector metal layer and the second subcollector metal layer form a bonded subcollector metal layer; and
removing the handle wafer, the bonded first and second glue metal layers, and the second etch stop layer from the second intermediate stack to form the HBT structure.

10. The method of claim 9, wherein the first etch stop layer comprises gallium indium arsenide (GaInAs), and the second etch stop layer comprises silicon dioxide ($SiO_2$).

11. The method of claim 9, wherein each of the first and second subcollector metal layers comprises at least one of titanium, platinum, and gold.

12. The method of claim 9, wherein the initial substrate wafer comprises indium phosphide (InP).

13. The method of claim 12, wherein the final substrate wafer comprises silicon (Si) or silicon carbide (SiC).

14. The method of claim 13, wherein the handle wafer comprises gallium arsenide (GaAs).

15. The method of claim 13, wherein the handle wafer comprises silicon (Si) or indium phosphide (InP).

16. The method of claim 9, wherein removing the initial substrate wafer and the first etch stop layer from the first intermediate stack comprises hydrochloric acid-based wet etching.

17. The method of claim 9, wherein removing the handle wafer, the bonded first and second glue metal layers, and the second etch stop layer from the second intermediate stack comprises wet etching the handle wafer using phosphoric acid/hydrogen peroxide-based wet etching, and dry etching the bonded first and second glue metal layers, and the second etch stop layer.

18. The method of claim 9, further comprising:
etching the HBT structure, using the bonded subcollector metal layer as an etch stop, to form a plurality of HBT mesa structures over the final substrate wafer.

19. The method of claim 9, wherein performing the metal-to-metal bonding between the first subcollector metal layer and the second subcollector metal layer comprises performing thermal compression bonding.

20. A method of forming a heterojunction bipolar transistor (HBT) structure, comprising:
providing an HBT epitaxial layer structure formed over a first substrate wafer;
inverting the HBT epitaxial layer structure and the first substrate wafer, and attaching the HBT epitaxial layer structure to a second substrate wafer via glue layers;
removing the first substrate wafer;
forming a first subcollector metal layer over the HBT epitaxial layer structure;
inverting the first subcollector metal layer and the HBT epitaxial layer structure, and thermal compression bonding the first subcollector metal layer to a second subcollector metal layer on a third substrate wafer; and
removing the second substrate wafer by wet etching, using the first and second subcollector metal layers as an etch stop.

* * * * *